(12) United States Patent
Tuohy

(10) Patent No.: US 7,421,358 B2
(45) Date of Patent: Sep. 2, 2008

(54) METHOD AND SYSTEM FOR MEASUREMENT DATA EVALUATION IN SEMICONDUCTOR PROCESSING BY CORRELATION-BASED DATA FILTERING

(75) Inventor: Garry Tuohy, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 65 days.

(21) Appl. No.: 11/539,917

(22) Filed: Oct. 10, 2006

(65) Prior Publication Data
US 2007/0177135 A1    Aug. 2, 2007

(30) Foreign Application Priority Data
Jan. 31, 2006    (DE) .................. 10 2006 004 411

(51) Int. Cl.
*G06F 19/00*    (2006.01)
(52) U.S. Cl. .............................. 702/81; 702/82; 702/83; 702/84; 702/181; 438/10; 438/12; 438/18
(58) Field of Classification Search .............. 702/181, 702/81–84, 35; 364/468.16, 468.17, 468.28; 438/10, 12, 18
See application file for complete search history.

(56) References Cited

U.S. PATENT DOCUMENTS

| | | | |
|---|---|---|---|
| 5,866,437 A | 2/1999 | Chen et al. ..................... | 438/14 |
| 5,991,699 A * | 11/1999 | Kulkarni et al. ............... | 702/83 |
| 2004/0175943 A1 | 9/2004 | Waksman .................... | 438/689 |
| 2005/0194590 A1 | 9/2005 | Matsushita et al. ............ | 257/48 |

FOREIGN PATENT DOCUMENTS

DE    196 13 615 A1    4/1996

* cited by examiner

*Primary Examiner*—John E. Barlow
*Assistant Examiner*—Sujoy K Kundu
(74) *Attorney, Agent, or Firm*—Williams, Morgan & Amerson

(57) ABSTRACT

By performing a contingency-based correlation test of measurement data, such as defect data, with respect to electrical test data after progressively filtering the measurement data, an enhanced analysis of process flow characteristics may be accomplished. Consequently, an efficient yield loss estimation may be performed.

26 Claims, 2 Drawing Sheets

METHOD AND SYSTEM FOR MEASUREMENT DATA EVALUATION IN SEMICONDUCTOR PROCESSING BY CORRELATION-BASED DATA FILTERING

BACKGROUND OF THE INVENTION

1. Field of the Invention

Generally, the present invention relates to the field of fabricating integrated circuits, and, more particularly, to the monitoring of process flow quality and production yield by evaluating measurement data.

2. Description of the Related Art

Today's global market forces manufacturers of mass products to offer high quality products at a low price. It is thus important to improve yield and process efficiency to minimize production costs. This holds especially true in the field of semiconductor fabrication, since, here, it is essential to combine cutting-edge technology with mass production techniques. It is, therefore, the goal of semiconductor manufacturers to reduce the consumption of raw materials and consumables while at the same time improving process tool utilization. The latter aspect is especially important, since, in modern semiconductor facilities, equipment is required which is extremely cost-intensive and represents the dominant part of the total production costs. Consequently, high tool utilization in combination with a product yield, i.e., with a high ratio of good devices and faulty devices, results in increased profitability.

Integrated circuits are typically manufactured in automated or semi-automated facilities, thereby passing through a large number of process and metrology steps to complete the device. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask used in further processes for forming device features in the device layer under consideration by, for example, etch, implant, deposition, polish processes and the like. Thus, layer after layer, a plurality of process steps are performed based on a specific lithographic mask set for the various layers of the specified device. For instance, a sophisticated CPU requires several hundred process steps, each of which has to be carried out within specified process margins to fulfill the specifications for the device under consideration. Since many of these processes are very critical, a plurality of metrology steps have to be performed to efficiently control the process flow. Typical metrology processes may include the measurement of layer thickness, the determination of dimensions of critical features, such as the gate length of transistors, the measurement of dopant profiles, the number, the size and the type of defects, electrical characteristics and the like. As the majority of the process margins are device-specific, many of the metrology processes and the actual manufacturing processes are specifically designed for the device under consideration and require specific parameter settings at the adequate metrology and process tools.

In a semiconductor facility, a plurality of different product types are usually manufactured at the same time, such as memory chips of different design and storage capacity, CPUs of different design and operating speed and the like, wherein the number of different product types may even reach hundreds and more in production lines for manufacturing ASICs (application specific ICs). Since each of the different product types may require a specific process flow, different mask sets for the lithography, specific settings in the various process tools, such as deposition tools, etch tools, implantation tools, chemical mechanical polishing (CMP) tools, metrology tools and the like, may be necessary. Consequently, a plurality of different tool parameter settings and product types may be encountered simultaneously in a manufacturing environment, thereby also creating a huge amount of measurement data, since typically the measurement data are categorized in accordance with the product types, process flow specifics and the like.

Hereinafter, the parameter setting for a specific process in a specified process tool or metrology or inspection tool may commonly be referred to as process recipe or simply as recipe. Thus, a large number of different process recipes, even for the same type of process tools, may be required which have to be applied to the process tools at the time the corresponding product types are to be processed in the respective tools. However, the sequence of process recipes performed in process and metrology tools or in functionally combined equipment groups, as well as the recipes themselves, may have to be frequently altered due to fast product changes and highly variable processes involved. As a consequence, the tool performance in terms of throughput and yield are very critical manufacturing parameters as they significantly affect the overall production costs of the individual devices. Therefore, great efforts are made to monitor the process flow in the semiconductor plant with respect to yield affecting processes or process sequences in order to reduce undue processing of defective devices and to identify flaws in process flows and process tools. For example, at many stages of the production process, inspection steps are implemented for monitoring the status of the devices. Moreover, other measurement data may be generated for controlling various processes, in which the measurement data may be used as feed forward and/or feedback data. It turns out, however, that the relevance of the inspection and measurement data may not necessarily be suitable for the evaluation of process quality, or the usability of measurement data for control applications may be reduced. For example, in certain processes, a large number of defects may be created, which may then be efficiently detected by respective inspection techniques, while the relevance of the large number of defects may not be appropriately evaluated with respect to the final operational behavior of the device due to a significant amount of irrelevant contributions. Consequently, implicit information that may be "encoded" in the measurement and inspection data, obtained by elaborate metrology techniques, may possibly be discarded, thereby contributing to a reduced production yield.

In view of the situation described above, there is therefore a need for an enhanced technique that enables efficient use of process data in a semiconductor production process.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables an efficient evaluation of measurement data obtained during a manufacturing sequence of semiconductor devices, wherein a second set of measurement data, which may act as a "reference" set due to a high significance of this data, for instance with respect to the final operational behavior, may be merged or combined, for instance correlated, with the previously obtained measurement data. For this purpose, measurement data obtained at a moderately intermediate manufacturing stage may be filtered in accordance with a predefined filter criterion so as to reduce non-relevant data or "noise" data from the set of measurement data prior to performing the merging process, thereby providing the potential for obtaining filtered measurement data having a high degree of significance with respect to the reference data so that the filtered measurement data may be evaluated on the basis of the reference data, thereby enabling the utilization of the filtered measurement data with significantly enhanced efficiency compared to the original raw data. In some illustrative embodiments, yield loss estimations may be performed at several stages of the manufacturing process on the basis of the filtered measurement data and the reference data.

According to one illustrative embodiment of the present invention, a method comprises obtaining a first set of measurement data from a plurality of positions of a substrate having formed thereon a plurality of semiconductor devices at a first manufacturing stage. The method further comprises obtaining a second set of measurement data from the plurality of positions of the substrate at a second manufacturing stage. Moreover, the first set of measurement data is filtered on the basis of the first filter criterion to obtain first filtered measurement data. Finally, a first degree of correlation of the first filtered measurement data with respect to the second set of measurement data is determined.

According to another illustrative embodiment of the present invention, a method comprises progressively filtering a first set of measurement data obtained from a plurality of positions of a substrate having formed thereon a plurality of semiconductor devices at a first manufacturing stage to generate a plurality of sets of progressively filtered measurement data. Moreover, a second set of measurement data from the plurality of positions of the substrate is obtained at a second manufacturing stage. Finally, the method comprises combining each of the plurality of sets of progressively filtered measurement data with the second set of measurement data to determine a value of a characteristic of each of said plurality of progressively filtered measurement data.

In yet another illustrative embodiment of the present invention, a system comprises an interface configured to receive a first set of measurement data and a second set of measurement data, wherein the first and second sets of measurement data represent measurement data obtained from two different manufacturing stages of a substrate comprising a plurality of semiconductor devices. The system further comprises a filter unit connected to the interface and configured to automatically extract one or more sets of filtered measurement data from the first set of measurement data. Furthermore, the system comprises a correlation unit connected to the filter unit and configured to determine a degree of correlation between the one or more sets of filtered measurement data and the second set of measurement data.

BRIEF DESCRIPTION OF THE DRAWINGS

The invention may be understood by reference to the following description taken in conjunction with the accompanying drawings, in which like reference numerals identify like elements, and in which.

Figure 1A:
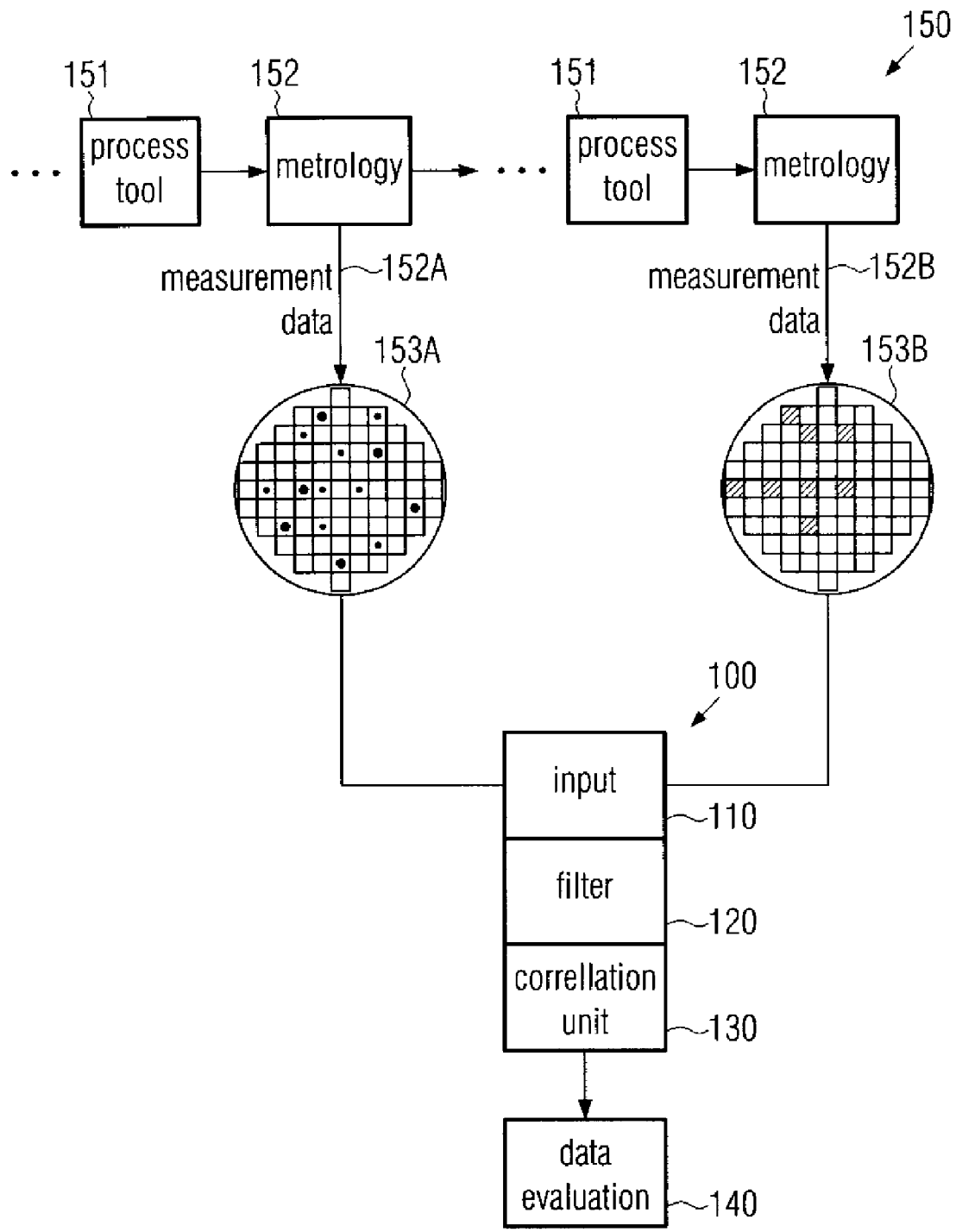
FIG. 1a schematically illustrates a manufacturing environment of a semiconductor facility that is functionally connected to a system for estimating the correlation of different sets of measurement data on the basis of a filter technique in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention relates to a technique for improving the productivity of a semiconductor plant by more efficiently exploiting information contained in measurement data to thereby, for instance, identify yield reducing process sequences and/or non-efficient process recipes, to enhance control efficiencies of advanced process control strategies by more effectively evaluating the corresponding measurement data supplied thereto and the like. To this end, measurement data obtained for a specific substrate, which may, for instance, indicate a defect rate, measurement values for critical dimensions and the like may be reduced, i.e., filtered, to remove any less relevant data. Consequently, the removal of less relevant or non-significant data from the set of measurement data may be considered as reducing the measurement "noise" of the corresponding measurement process, thereby providing filtered measurement data, which may reveal process characteristics that may otherwise not have been observed.

The process of removing less relevant data from a given measurement data set may be accomplished by using appropriate measurement data, i.e., data having reduced noise, which may be considered as reference data, and combining or merging the filtered measurement data with the reference data to determine, for instance, a degree of correlation, a die loss and the like for the set of measurement data that has been filtered on the basis of a predefined filter criterion. For example, if the filtered measurement data may exhibit a significantly increased correlation with respect to the reference data compared to the non-filtered data, the respective filter criterion used may be identified as an appropriate filter criterion and may be used to obtain data of increased statistical significance for the measurement process under consideration. In other illustrative embodiments, the filtering process may be performed in a progressive manner, i.e., the filtering process may be performed on the basis of progressively restricted filter criteria so that a plurality of differently, i.e., progressively, filtered measurement data is available, for which respective degrees of correlation may be determined. In other embodiments, the correlation may be used as a "quality monitor" of the measurement data, from which a die loss may be calculated for every filtering step to select an appropriate filtering process on the basis of the calculated die loss. In some illustrative embodiments, the term "progressively filtering" may indicate a filtering process in which the initial measurement data are filtered with respect to the same filter criterion but with an increasingly restrictive filter behavior. In other illustrative embodiments, the term "progressively filtering" may include a plurality of consecutive filtering processes, wherein a different filter criterion may be applied to a filtered measurement data set that has previously been filtered by a different criterion. For example, in the former case, a filter criterion may be selected, such as the size or area of a defect detected by optical inspection, the number of defects per unit area and the like, wherein, in each filtering step, the corresponding filtering action or range may be set more restrictively. That is, it may be assumed that the influence of a defect may increase with its size, thereby rendering the corresponding larger defects more relevant compared to a smaller defect. Consequently, during the progressive filtering process, the filter arrangement may be set so as to detect defects at or above a certain size, while neglecting effects below the threshold. In the latter case, different filter criteria, such as size, shape, position within a predefined area, number of defects per unit area and the like, may be successively applied in order to reduce the noise in the original measurement data, thereby providing the potential for identifying appropriate filter "threads" that may be used in a corresponding manufacturing environment for obtaining measurement data of increased relevance.

In generating a measure for the correlation of the filtered measurement data with the reference data, which may represent measurement data of high relevance, such as electrical data obtained during one or more intermediate manufacturing stages, such as at the stage of wafer sorting, i.e., electrical testing of substantially completed semiconductor devices at a wafer level for evaluating the electrical performance of the individual devices, a correlation test for at least a plurality of positions for the substrate having created the original measurement data may be performed on the basis of any appropriate algorithm. In some illustrative embodiments, a contingency-based algorithm may be applied, wherein the question of a statistically significant correlation between the reference data and the filtered measurement data for a plurality of positions may be answered by using appropriately defined contingency tables. Since the reference data may be strongly correlated with the actual device performance, i.e., the reference data may actually represent the measured electrical performance of the device, an appropriate process for reducing noise of inline measurement data may be identified, once a significant correlation between the filtered measurement data and the reference data is obtained. Consequently, upon identification of an efficient noise reduction technique for various measurement data created during various manufacturing stages of semiconductor devices, a meaningful estimation of involved processes may be performed. For example, based on filtered measurement data obtained by the correlation procedure described above, meaningful statements regarding the yield loss of specific process sequences may be made in order to characterize the quality of the respective process sequence. In other cases, feed forward and feedback measurement data as are typically used in highly advanced process tools and sequences may be "refined" by appropriately identified filtering regimes in order to further enhance the control efficiency. For instance, measurement data of critical dimensions obtained during the formation of metallization layers in advanced devices may be used for controlling the patterning process, wherein the relevance of the respective measurement data may be evaluated and possibly re-adjusted by correlating the corresponding measurement data with one or more electrical data, such as measurement data for the sheet resistivity, electromigration test data and the like. Although the measurement data of the critical dimension may already be correlated to the electrical test data, an appropriately designed filtering process may nevertheless increase the efficiency or relevance of the CD measurement data. Hence, the present invention provides an enhanced technique for increasing the efficiency of measurement data during the manufacturing of semiconductor devices, wherein an improvement may be achieved at substrate level or at any other level involving a high degree of data aggregation.

Figure 1B:
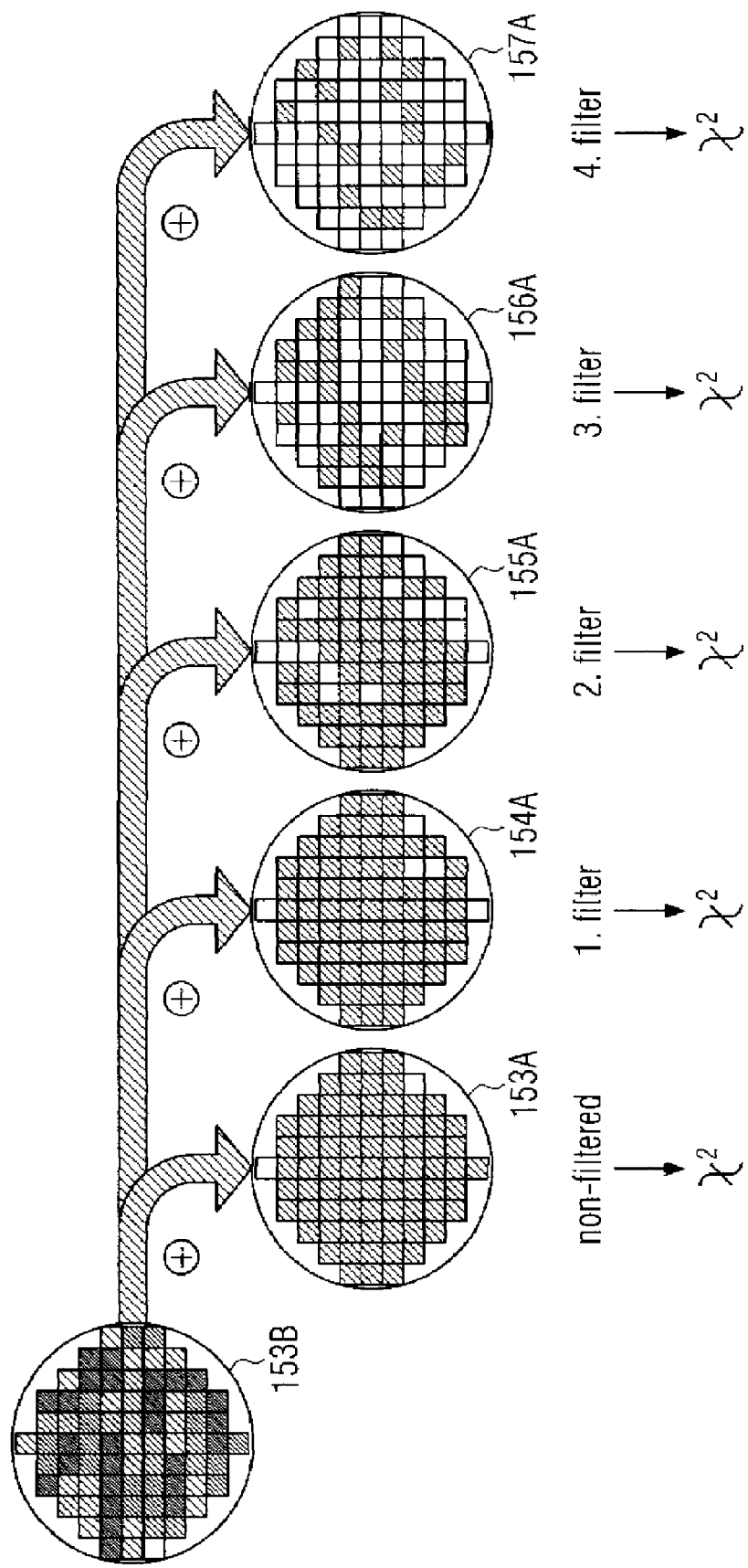
FIG. 1b schematically illustrates one illustrative operational mode for progressively filtering a set of measurement data and obtaining respective correlation values on the basis of a set of reference data according to illustrative embodiments of the present invention.

With reference to FIGS. 1a-1b, further illustrative embodiments of the present invention will now be described in more detail. FIG. 1a schematically shows a manufacturing environment 150 comprising a plurality of production process tools 151 and a plurality of metrology tools 152. The manufacturing environment 150 may be configured to process semiconductor devices, wherein the process tools 151 may include tools for performing lithography processes, etch processes, deposition processes, implantation processes, polishing processes, heat and anneal processes and the like, as are typically required for the production of advanced semiconductor devices. The metrology tools 152 may be configured to generate appropriate measurement data on the basis of appropriately designed measurement processes, such as optical inspection, measurement of critical dimensions, measurement of electrical characteristics and the like. As previously explained, in sophisticated semiconductor manufacturing facilities, a large number of highly complex process steps has to be performed in the process tools 151, wherein the metrology tools 152 may provide measurement data used for controlling the quality of process sequences and also to perform enhanced process control strategies. Thus, the metrology tools 152 are configured to provide respective sets of measurement data 152A and 152B, wherein the sets of measurement data 152A, 152B may be obtained on substrate level, i.e., substantially each substrate to be processed in the environment 150 may be subjected to a measurement process or, in other cases, dedicated substrates, such as test substrates, may undergo a measurement process in order to obtain the respective measurement data. Typically, at least a plurality of measurement sites for each substrate may be subjected to a metrology process, such as a defect inspection, a measurement of electrical characteristics and the like, while, in other cases, specified test regions on the substrate may be provided for the creation of appropriate measurement data. In still other cases, substantially each individual die, i.e., area including a semiconductor device, may be subjected to measurement in order to estimate one or more characteristics of each of the devices prior to separating the individual die regions. For example, so-called wafer sort processes are usually performed on substantially completed semiconductor devices at substrate level, wherein the electrical performance of each semiconductor device is tested and evaluated.

For example, the metrology tool 152 generating the measurement data 152B may be an electrical test device probing each of the individual die regions in a substrate so as to estimate the electrical performance thereof. Based on the corresponding measurement results, the measurement data 152B may, for instance, include a substrate map indicated as 153B, in which respective measurement data for each of the individual die regions are contained. For example, the map 153B may indicate a specific electrical characteristic, such as a sheet resistance, operating speed and the like, while in some cases the map 153B may merely indicate a binary information for each device in the form "operational or non-operational." Similarly, the metrology tool 152 generating the measurement data 152A in any intermediate manufacturing stage may create a corresponding map 153A, wherein it should be appreciated that the map 153A may include only a few measurement positions, which may not necessarily be located within actual die regions, while in other cases a substantially complete map may be provided, for instance in the form of a map indicating the location/size and/or density of defects, as is exemplarily indicated by 153A.

A system 100 for evaluating the relevance of measurement data on the basis of reference measurement data is functionally connected to the manufacturing environment 150. The system 100 may comprise an input section 110 that is configured to receive measurement data that have to be estimated with respect to its correlation with other measurement data, which may be used as a reference data. Thus, in the embodiment shown, the input section 110 may be configured to receive the measurement data 152A as a first set of measurement data, the statistical significance of which is to be increased so as to extract information of increased relevance therefrom. Moreover, the input section 110 may also receive the measurement data 152B, which may, in one illustrative embodiment, represent electrical measurement data, for instance in the form of a wafer sort map, such as the map 153B, so that the measurement data 152B are highly correlated with the actual performance of the individual devices formed on a respective semiconductor substrate. It should be appreciated that the system 100 may, in some illustrative embodiments, be directly connected to a supervising control system, such as a manufacturing execution system (MES) as is typically provided in modern semiconductor facilities. In other cases, the system 100 may be connected to one or more of the metrology tools 152 by any appropriate interface system (not shown) typically provided in advanced metrology tools. In still other cases, the input section 110 may receive the corresponding measurement data 152A, 152B from other sources, such as one or more of the process tools 151, by operator and the like.

The system 100 further comprises a filter unit 120 connected to the input section 110 and configured to process the measurement data 152A on the basis of one or more predefined filter criteria. It should be appreciated that the system 100 is configured to operate on the measurement data 152A in an appropriate fashion so as to manipulate the measurement data according to the one or more predefined filter criteria, thereby producing one or more sets of filtered measurement data. For instance, depending on the type of metrology tool 152, the measurement data 152A may be provided as a set of numbers correlated to specific substrate positions, as is for instance indicated in the map 153A, wherein the respective set of numbers may identify specific characteristics of the measured object. That is, when the measurement data 152A may represent defect data, the size, the shape thereof, the position within a die region, the defect density within each die and the like, may be specified in any appropriate format such as corresponding numerical values and the like. Consequently, the filter unit 120 may have implemented therein a corresponding operational unit that may perform the required filter operation on the basis of the data format corresponding to the measurement data 152A. In other illustrative embodiments, the system 100 may comprise, in the input section 110 or in the filter unit 120, appropriate data processing units for appropriately converting the measurement data 152A in any appropriate format that may then be handled by the filter unit 120. For instance, the measurement data 152A may be obtained in the form of image data from which the corresponding data processing units may extract relevant data that may be subjected to the desired filtering process. The system 100 further comprises a correlation unit 130 connected to the filter unit 120 to receive therefrom one or more filtered versions of the measurement data 152A. Moreover, the correlation unit 130 may be configured to determine a degree of correlation between one or more sets of filtered measurement data originating from the measurement data set 152A with respect to the measurement data 152B. Consequently, by determining the degree of correlation in relation to the respective filtering process, measurement data may be provided that may be more efficiently used in other data evaluation units 140, which may be functionally associated with the manufacturing environment 150. In one illustrative embodiment, the data evaluation unit 140 may represent a yield loss estimator that is configured to operate on the filtered data of the measurement data 152A in combination with values for the degree of correlation supplied by the correlation unit 130. Consequently, by means of the unit 140, the influence of various sections of the environment 150 on the total yield may be efficiently estimated.

During the operation of the environment 150, semiconductor substrates may be processed by the process tools 151 from which a certain fraction or all of the substrates may be subjected to a measurement process by the metrology tools 152, thereby generating the measurement data 152A. The measurement data 152A may be received by the input section 110 and may be stored therein until the second measurement data 152B are available. In other cases, the measurement data 152A and the measurement data 152B may be provided by the MES of the environment 150 at any appropriate stage. After having received both sets of measurement data 152A, 152B, i.e., after one or more specified substrates have passed through the section of the manufacturing environment 150 under consideration, the data 152A may be subjected to one or more filtering processes on the basis of predefined criteria, as is previously explained. In some illustrative embodiments, the filter unit 120 is configured to progressively filter the data 152A on the basis of the same filter criterion with an increasingly restrictive filter behavior. In one illustrative embodiment, the measurement data 152A may represent defect-related data, wherein an appropriate filter criterion may represent the size of individual defects detected by the corresponding inspection tool. For example, in many stages of the manufacturing environment 150, CMP processes may be performed, for instance during the formation of metallization layers for removing excess material and planarizing the surface topography and the like, wherein, after the polishing process, the defect rate may be determined. Due to the nature of the polishing process, frequently substantially each die region of the substrate may include a plurality of defects detected by the inspection tool, thereby generating the measurement data 152A in a form that may include a large amount of non-relevant information, since many of the defects created during the polishing process may not significantly influence the overall performance of the finalized device. That is, based on the measurement data 152A as provided after the polishing process, a significant correlation between the electrical measurement data 152B obtained after finalizing the devices may be substantially "hidden," as substantially no dependence of the electrical behavior indicated by map 153B may be "visible." Hence, the data 152A may be subjected to a filtering process that will be exemplarily described in more detail with reference to FIG. 1b.

FIG. 1b schematically illustrates the substrate map 153B, which is a representation of the measurement data 152B, representing in this illustrative embodiment electrical measurement data. Although the electrical measurement data may allow a categorization of the performance of the respective devices in any appropriate manner, for instance in a continuous manner by indicating a numerical value, or in the form of separate categories, in this illustrative example it may be assumed, for convenience, that the information in the measurement data 152B and thus in the substrate map 153B is used in a binary form, thereby classifying the individual devices as devices having failed or passed the electrical test. The corresponding measurement data 152B may be supplied to the correlation unit 130, which may also receive the non-filtered measurement data 152A as is indicated in the form of the respective substrate map 153A indicating any defects in the individual die regions. The corresponding data sets represented by the maps 153A and 153B may be subjected to a correlation test, for instance on the basis of a contingency algorithm, in order to determine the degree of correlation between the two data sets. In the above-mentioned example, when the substrate map 153A corresponds to a post-polish inspection process, substantially each of the die regions may have one or more defects. For convenience, it may be assumed that only two states of defective die are indicated, i.e., "defective" die and "clean" die, wherein for instance the decision is made by the respective inspection tool, i.e., by the minimum defect size detectable by the tool. That is, whenever a defect is detected, the corresponding die is considered as a defective die. Consequently, for the respective substrate map 153A, 0 dies may have been detected as being clean, while 96 die may be assessed as defective.

Next, the measurement data 152A may be subjected to a first filtering process, for instance on the basis of a filter criterion determining a minimum defect size, below which a defect is considered as being not present. Consequently, after re-processing the measurement data 152A according to the respective filter criterion and the setting of the filter criterion in the first step by selecting an appropriate minimum size, a filtered substrate map 154A may be obtained, wherein, for instance, 10 dies may be considered clean, while 86 die are still evaluated as defective die. In a next filter step, a more restrictive range for the specified criterion, that is, an even increased minimum size of the defects, may be selected so that a further substrate map 155A may be generated. For example, the minimum size in each of the filtering steps may be obtained as a multiple of the initial minimum defect size detectable by the corresponding inspection tool. It should be appreciated, however, that any other value for the restricted range in the first, second and further filter step may be used. The resulting filter process may yield 19 clean dies and thus 77 defective die. Similarly, in a third filter step having a further increased restriction with respect to the corresponding filter criterion, such as the defect size, a further filtered set of measurement data represented by a substrate map 156A may be created. Hereby, it may be assumed that 60 clean die are obtained, while 36 defective die are detected. In a next filtering step, an even increased restriction, i.e., only defects having a size above a threshold higher than a threshold of any of the filter processes performed before, may be performed and may yield a corresponding set of filtered data represented by a substrate map 157A, wherein it may be assumed that 77 clean die are detected and thus 19 defective die are still present. It should be appreciated that the above sequence of filtering steps is of illustrative nature only and other filter criteria in combination with respective increasingly restricted filter ranges may be used to obtain progressively filtered data sets.

As is evident from the filtering process, the number of clean die may increase with each filtering step, while equivalently the number of defective die decreases. After filtering the measurement data 152A, for instance on the basis of a progressive filtering process as described above, the respective filtered measurement data sets, represented by the substrate maps 153A, 154A, 155A, 156A, 157A are supplied to the correlation unit 130 in order to determine the degree of correlation of each data set with the measurement data 152B, represented in FIG. 1b by the corresponding substrate map 153B. For example, measurement data of the map 153B may indicate that 57 die have failed, while 39 die have passed the electrical test. In order to answer the question whether the measurement data 152A are independent from the measurement data 152B, in some illustrative embodiments a corresponding contingency algorithm may be used to reject the null hypothesis that no correlation exists or otherwise verifying the hypothesis that both measurement data sets are dependent. In the above-specified example, a corresponding contingency table is composed of two rows and two columns due to the fact that only two states are considered for both measurement data sets. Thus, based on the respective data sets represented by the maps 153A, 154A, 155A, 156A, 157A and the reference data 153B, the following contingency tables may be established.

TABLE 0

|  | Pass | Fail | Total |
|---|---|---|---|
| Clean | 0 | 0 | 0 |
| Defective | 39 | 57 | 96 |
| Total | 39 | 57 |  |

TABLE 1

|  | Pass | Fail | Total |
|---|---|---|---|
| Clean | 4 | 6 | 0 |
| Defective | 35 | 51 | 86 |
| Total | 39 | 57 |  |

TABLE 2

|  | Pass | Fail | Total |
|---|---|---|---|
| Clean | 4 | 11 | 19 |
| Defective | 31 | 46 | 77 |
| Total | 39 | 57 |  |

TABLE 3

|  | Pass | Fail | Total |
|---|---|---|---|
| Clean | 29 | 11 | 40 |
| Defective | 10 | 26 | 36 |
| Total | 39 | 37 |  |

TABLE 4

|  | Pass | Fail | Total |
|---|---|---|---|
| Clean | 29 | 31 | 00 |
| Defective | 10 | 26 | 36 |
| Total | 39 | 57 |  |

As is evident from Table 0, zero clean die are present according to the non-filtered data, wherein 96 die are considered defective die, from which 39 have passed and 57 have failed the electrical test according to the data 152B. Similarly, Tables 1-4 represent the corresponding data for the filtering steps 1-4 as illustrated in FIG. 1b. For each of the contingency tables 0-4, a respective correlation test may be performed by, for instance, calculating the square of $\chi$ on the basis of the following equation:

$$X^2 = \sum_{i,j} \frac{(n_{ij} - E(n_{ij}))^2}{E(n_{ij})}$$

$$E(n_{ij}) = \frac{r_i c_j}{n}$$

wherein $n_{ij}$ represents the number of events in the respective cell of the contingency table, $E(n_{ij})$ represents the expected value for the number of events in the respective cell, and $r_i$ and $c_j$ represent the corresponding total number of events of the row i and the column j, as is also illustrated in Tables 0-4. By calculating the corresponding $\chi^2$ values for the respective contingency tables, the degree of correlation of the respective filtered or non-filtered data with reference data 152B may be determined. Consequently, based on these calculated correlation values, an appropriate filtered data set and thus an appropriate filtering process may be selected. For the above-described example, the resulting $\chi^2$ values are 0, 0.02, 3.94 and 3.76, respectively, for the Tables 0-4.

In some illustrative embodiments, the maximum value of the degree of correlation may be selected for determining an appropriate filtered set of data. Moreover, the degree of correlation determined may be compared to a level of significance ($\alpha$) by determining a critical $\chi^2$ value in accordance with well-established techniques. In the above-described example, Table 3, representing the third filtering step, i.e., representing the substrate map 156A, may be selected as an appropriate set of data having a desired confidence level for rejecting the hypothesis that the data sets represented by the map 156A and the map 153B are independent. Thus, the data 156A may be used for evaluating process flow characteristics at and prior to the manufacturing stage as defined by the creation of the measurement data 152A. For example, in one illustrative embodiment, the filtering process defined by the selected set of measurement data 156A may, for instance, be implemented in a procedure for evaluating the measurement data 152A on an automated basis to provide meaningful inline measurement data substantially without a significant delay. In order to confirm the relevance of the filtering procedure as determined in accordance with the principles described above, in other embodiments, a plurality of sets of measurement data 152A may be processed in substantially the same manner in order to determine whether or not the same degree of filtering provides a desired level of significance, thereby indicating the robustness of the determined filtering process. In other illustrative embodiments, the above-described sequence may be performed individually for each substrate so as to determine a respective set of measurement data for each of the substrates, wherein the number of filtering steps may vary but nevertheless result in a data set, the correlation of which is above a level of significance compared to the initial data in order to provide information of increased significance with respect to the initially generated measurement data 152A. For example, the yield loss at a certain manufacturing stage may be effectively determined on the basis of the filtered measurement data, thereby providing valuable information on the quality of the involved production processes. Moreover, by automatically generating corresponding measurement data and automatically comparing the same with appropriate electrical data, or other reference data according to the principles set forth above, a plurality of filter criteria may be "screened" in order to identify appropriate filter regimes or threshold values that may then be used during the inline measurement processes for endowing the corresponding measurement data with an increased significance.

In other embodiments, the selection of an appropriate filter from the plurality of filtered measurement data, as represented by the maps 154A, 155A, 156A, 157A, may be performed on the basis of the respective die loss obtained by estimating the respective die loss for each of the substrate maps 154A, 155A, 156A, 157A, wherein the calculated correlation may be used for estimating the "quality" of the obtained die loss. Thus, a strong correlation between some of the maps 154A, 155A, 156A, 157A may indicate a high relevance of the measurement data so that, for example, the filter thread may be selected that provides the maximum die loss.

For example, in the above-described illustrative case of measurement data related to a polishing process, it may be recognized that three filter steps with respect to a specific criterion, such as a defect area, may result in a high correlation to actual performance data, such as the electrical measurement data 152B, obtained from substrates processed by a specific process sequence involving dedicated polishing tools, while other data may indicate a significantly lower correlation when subjected to the same filtering process for substrates processed by different polishing tools. Consequently, a corresponding group of tools or an individual tool may be identified as a source of reduced process efficiency. In other measurement data sets, which may belong to different process sequences, other filter criteria such as the location of certain defects within a single substrate may have an increased correlation and may therefore be used to identify the corresponding tool or tool group as a low efficiency tool. It should be appreciated that the above-described embodiments for obtaining a degree of correlation may be extended to more complex regimes in which more than two different states in the corresponding measurement data set may be represented. In the above-described contingency algorithm, this may be taken into consideration by appropriately defining the respective contingency tables.

As a result, the present invention provides an enhanced technique for the evaluation of measurement data on the basis of other measurement data having reduced "noise" compared to the measurement data to be evaluated. This may be accomplished by filtering the measurement data under consideration on the basis of one or more specific filter criteria and estimating the degree of correlation for the progressively filtered measurement data on the basis of the measurement data with reduced noise. For this purpose, contingency-based algorithms may be efficiently used in order to obtain a degree of correlation, wherein the filtering process may be performed in an automated fashion. In illustrative embodiments, the reference data may be provided in the form of electrical measurement data, which per se have a high correlation to the actual performance of the respective semiconductor devices. Consequently, measurement data obtained during any intermediate production stage of the semi-conductor devices may be efficiently filtered and merged with the electrical data in order to identify whether and at which filtering stage a desired level of correlation is achieved to extract valuable information from the filtered data, for instance with respect to yield loss, control efficiency and the like. Hence, a plurality of filter regimes may be established, which may then be used during inline measurement processes for increasing the signal to noise ratio of the corresponding measurement data. Moreover, inefficient process tools or process sequences may be effectively identified on the basis of inline measurement data, when re-evaluated on the basis of the correlation to the electrical measurement data. Thus, by performing a contingency-based correlation test of measurement data, such as defect data, with respect to electrical test data after progressively filtering the measurement data, an enhanced analysis of process flow characteristics may be accomplished. Consequently, an efficient yield loss estimation may be performed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    obtaining a first set of measurement data from a plurality of positions of a substrate having formed thereon a plurality of semiconductor devices at a first manufacturing stage;
    obtaining a second set of measurement data from said plurality of positions of said substrate at a second manufacturing stage;
    filtering said first set of measurement data on the basis of a first filter criterion to obtain first filtered measurement data for each of said plurality of positions; and
    determining a first degree of correlation of said first filtered measurement data with said second set of measurement data.

2. The method of claim 1, wherein said second set of measurement data is measurement data representing at least one electrical characteristic of said plurality of semiconductor devices.

3. The method of claim 1, wherein said first set of measurement data represents inspection data indicating defects on said substrate.

4. The method of claim 1, wherein said first set of measurement data represents one or more critical dimensions of said semiconductor devices at said first manufacturing stage.

5. The method of claim 3, wherein said first filter criterion represents an area of a defect.

6. The method of claim 3, wherein said first filter criterion represents at least one of a structural configuration and a number per unit area of said defects.

7. A method, comprising:
    obtaining a first set of measurement data from a plurality of positions of a substrate having formed thereon a plurality of semiconductor devices at a first manufacturing stage;
    obtaining a second set of measurement data from said plurality of positions of said substrate at a second manufacturing stage;
    filtering said first set of measurement data on the basis of a first filter criterion to obtain first filtered measurement data for each of said plurality of positions;
    determining a first degree of correlation of said first filtered measurement data with said second set of measurement data; and
    filtering at least one of said first set of measurement data and said first filtered measurement data on the basis of a second filter criterion and determining a second degree of correlation of said second filtered measurement data with said second set of measurement data, selecting one of said first and second filtered measurement data having a maximum degree of correlation of said first and second degrees of correlation, and evaluating said first set of measurement data on the basis of said selected filtered measurement data.

8. The method of claim 7, wherein said second filter criterion represents a restricted version of said first filter criterion.

9. The method of claim 7, further comprising estimating a yield loss for said semiconductor devices at said first manufacturing stage on the basis of said selected filtered measurement data.

10. The method of claim 1, wherein determining a first degree of correlation comprises using a contingency algorithm.

11. A method, comprising:
    progressively filtering a first set of measurement data obtained from a plurality of positions of a substrate having formed thereon a plurality of semiconductor devices at a first manufacturing stage so as to generate a plurality of sets of progressively filtered measurement data;
    obtaining a second set of measurement data from said plurality of positions of said substrate at a second manufacturing stage; and
    combining said second set of measurement data with each of said plurality of sets of progressively filtered measurement data to determine for each of said plurality of sets of progressively filtered measurement data a value of a characteristic of said plurality of sets of progressively filtered measurement data.

12. The method of claim 11, wherein said characteristic represents a degree of correlation with said second set of measurement data.

13. The method of claim 11, wherein said characteristic represents a yield loss rate of said plurality of semiconductor devices obtained on the basis of each of said plurality of sets of progressively filtered measurement data.

14. The method of claim 13, wherein said one of the plurality of progressively filtered measurement data is selected as the one indicating a maximum yield loss rate.

15. The method of claim 13, wherein selecting one of said plurality of sets of filtered measurement data comprises determining a maximum degree of correlation and selecting said set of measurement data associated with said determined maximum degree of correlation.

16. The method of claim 13, wherein determining a degree of correlation for each of said set of progressively filtered measurement data comprises using a contingency algorithm.

17. The method of claim 11, wherein said second set of measurement data is measurement data representing at least one electrical characteristic of said plurality of semiconductor devices.

18. The method of claim 11, wherein said first set of measurement data represents inspection data indicating defects on said substrate.

19. The method of claim 18, wherein a filter criterion used for progressively filtering said first set of measurement data represents an area of a defect.

20. The method of claim 18, wherein a filter criterion used for progressively filtering said first set of measurement data represents at least one of a structural configuration and a number per unit area of said defects.

21. The method of claim 11, further comprising selecting one of said plurality of sets of progressively filtered measurement data on the basis of said values of said characteristic and evaluating said first set of measurement data on the basis of said selected set of filtered measurement data.

22. The method of claim 21, wherein said one of the plurality of progressively filtered measurement data is selected as the one indicating a maximum yield loss rate.

23. The method of claim 21, wherein selecting one of said plurality of sets of filtered measurement data comprises determining a maximum degree of correlation and selecting said set of measurement data associated with said determined maximum degree of correlation.

24. A system comprising:
an interface configured to receive a first set of measurement data and a second set of measurement, the first and second sets of measurement data representing measurement data obtained from two different manufacturing stages of a substrate comprising a plurality of semiconductor devices;
a filter unit connected to said interface and configured to automatically extract one or more sets of filtered measurement data from said first set of measurement data; and
a correlation unit connected to said filter unit and configured to determine a degree of correlation between said one or more sets of filtered measurement data and said second set of measurement data.

25. The system of claim 24, wherein said first set of measurement data represents defect inspection measurement data and said filter unit comprises a defect-based filter module configured to filter said first set of measurement data with respect to one or more predefined defect criteria observed in said semiconductor devices.

26. The system of claim 24, wherein said correlation unit comprises a contingency-based correlation unit.

* * * * *